(12) United States Patent
Karikalan et al.

(10) Patent No.: US 12,463,319 B2
(45) Date of Patent: Nov. 4, 2025

(54) INTEGRATED ANTENNAS ON SIDE WALL OF 3D STACKED DIE

(71) Applicant: Avago Technologies International Sales Pte. Limited, Singapore (SG)

(72) Inventors: Sam Karikalan, Ladera Ranch, CA (US); Sam Zhao, Irvine, CA (US); Mayank Mayukh, Fort Collins, CO (US); Dharmendra Saraswat, Foothill Ranch, CA (US); Liming Tsau, Irvine, CA (US); Arun Ramakrishnan, Lake Forest, CA (US); Reza Sharifi, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 548 days.

(21) Appl. No.: 17/876,518

(22) Filed: Jul. 28, 2022

(65) Prior Publication Data
US 2024/0039141 A1 Feb. 1, 2024

(51) Int. Cl.
| | |
|---|---|
| *H01L 23/498* | (2006.01) |
| *H01L 23/00* | (2006.01) |
| *H01L 23/48* | (2006.01) |
| *H01L 25/00* | (2006.01) |
| *H01L 25/065* | (2023.01) |
| *H01Q 1/22* | (2006.01) |
| *H01Q 9/04* | (2006.01) |

(52) U.S. Cl.
CPC ......... *H01Q 1/2283* (2013.01); *H01L 23/481* (2013.01); *H01L 23/49822* (2013.01); *H01L 24/32* (2013.01); *H01L 24/83* (2013.01); *H01L 25/0657* (2013.01); *H01L 25/50* (2013.01); *H01Q 9/0407* (2013.01); *H01L 24/29* (2013.01); *H01L 2224/2919* (2013.01); *H01L 2224/32145* (2013.01); *H01L 2224/8385* (2013.01); *H01L 2924/0665* (2013.01)

(58) Field of Classification Search
CPC .............. H01L 25/0657; H01L 23/481; H01L 23/49822
See application file for complete search history.

(56) References Cited

U.S. PATENT DOCUMENTS

| | | | |
|---|---|---|---|
| 8,531,043 B2 * | 9/2013 | Ha ................. | H01L 25/0652 257/788 |
| 10,818,640 B1 | 10/2020 | Yu et al. | |
| 10,840,218 B2 | 11/2020 | Lin et al. | |
| 11,018,073 B2 | 5/2021 | Lin et al. | |

(Continued)

OTHER PUBLICATIONS

Thadesar et al. (2016) "Through-Silicon Vias: Drivers, Performance, and Innovations" 11 pages.

*Primary Examiner* — Dale E Page
*Assistant Examiner* — Wilner Jean Baptiste
(74) *Attorney, Agent, or Firm* — Quarles & Brady LLP

(57) ABSTRACT

A semiconductor package with integrated side wall antennas is provided. An apparatus includes two or more die layers that are bonded together, each of the two or more die layers comprising a top surface, bottom surface, and one or more side walls. A first side wall of the one or more side walls includes a first antenna array, the first antenna array comprising a first plurality of antenna array elements formed in at least one of the two or more die layers, wherein the first plurality of antenna array elements is at least partially exposed at the first side wall.

8 Claims, 7 Drawing Sheets

(56) References Cited

U.S. PATENT DOCUMENTS

| | | |
|---|---|---|
| 2007/0228544 A1 | 10/2007 | Jung et al. |
| 2010/0127937 A1* | 5/2010 | Chandrasekaran ... H01L 23/645 438/667 |
| 2010/0164671 A1* | 7/2010 | Pagani .................... H01L 24/32 336/200 |
| 2011/0272820 A1 | 11/2011 | Lee et al. |
| 2014/0308907 A1* | 10/2014 | Chen .................... H05K 1/0216 361/728 |
| 2021/0367330 A1 | 11/2021 | Fay |

* cited by examiner

INTEGRATED ANTENNAS ON SIDE WALL OF 3D STACKED DIE

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for a semiconductor package with an antenna integrated into a side wall.

BACKGROUND

Sixth generation (6G) cellular services typically utilize sub-terahertz (THz) ultra-high frequencies, such as 300 gigahertz (GHz) and above. Free space wavelengths at ultra-high frequencies are therefore 1 mm or less. Antenna arrays for beam-forming such small wavelengths are typically implemented at the wafer level rather than at the package level, as spacing between antenna array elements are often fractions of a wavelength. However, conventional implementations of wafer-level antenna arrays may pose constraints on radiation patterns, die orientation, and size of semiconductor packages.

Thus, methods, systems, and apparatuses for semiconductor packages with side-wall integrated antennas are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figure 1:
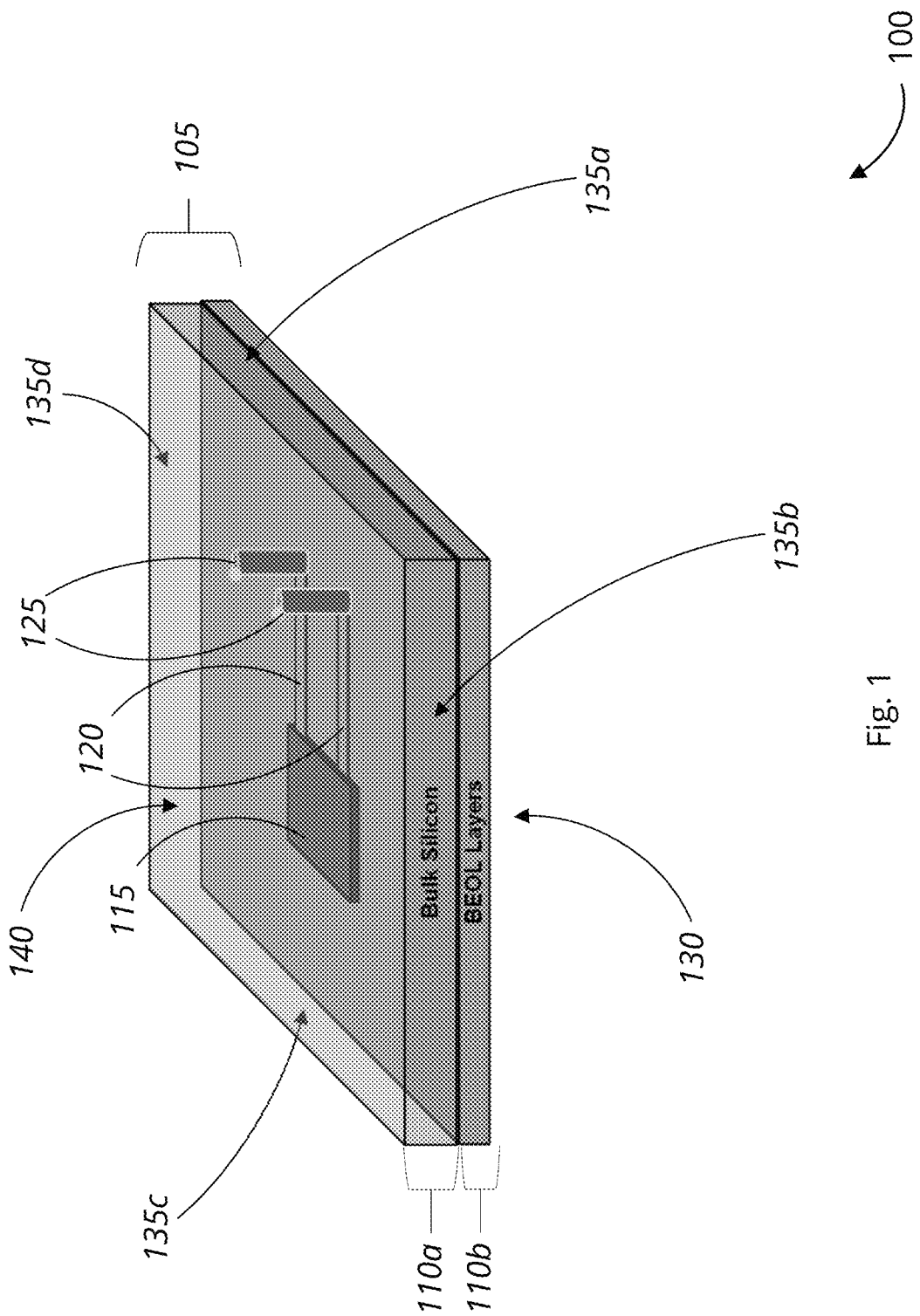
FIG. 1 is a schematic diagram of a die layer which is part of a semiconductor package with integrated side wall antennas, in accordance with various embodiments.

Various embodiments set forth a semiconductor package with integrated side wall antennas, and methods of manufacturing a semiconductor package with integrated side wall antennas.

In some embodiments, an apparatus for a semiconductor package with integrated side wall antennas is provided. The apparatus includes two or more die layers that are bonded together, each of the two or more die layers comprising a top surface, bottom surface, and one or more side walls. A first side wall of the one or more side walls includes a first antenna array, the first antenna array including a first plurality of antenna array elements formed in at least one of the two or more die layers, wherein the first plurality of antenna array elements is exposed at the first side wall.

In further embodiments, a semiconductor device integrated side wall antennas is provided. The semiconductor device includes a bottom die comprising an active chip, and a three-dimensional (3D) stacked die package coupled to the bottom die. The 3D stacked die package includes two or more die layers that are bonded together, each of the two or more die layers comprising a top surface, bottom surface, and one or more side walls. A first side wall of the one or more side walls includes a first antenna array, the first antenna array comprising a first plurality of antenna array elements formed in at least one of the two or more die layers, wherein the first plurality of antenna array elements is exposed at the first side wall.

In further embodiments, a method of manufacturing a semiconductor package with integrated side wall antennas is provided. The method includes stacking two or more die layers, each of the two or more die layers comprising at least one interconnect respectively, and bonding the two or more die layers to form a three-dimensional (3D) stacked die package, the 3D stacked die package comprising a top surface, bottom surface, and one or more side walls. The method further includes exposing each of the at least one interconnect of the two or more die layers, at at least one side wall of the one or more side walls, wherein exposing each of the at least one interconnects includes making each of the at least one interconnect accessible from an exterior of the 3D stacked die package, and forming one or more antenna elements of an antenna array at the at least one side wall of the one or more side walls.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Conventional antenna arrays are typically realized at the wafer level, integrated with a radio frequency integrated circuit (RFIC) utilizing very low parasitic connections and hybrid Cu—Cu bonding. Antenna arrays implemented in this manner are typically positioned on a top side of the die and/or the top side of a 3D stacked die package, introducing constraints on radiation patterns, orientation, and package size.

The proposed 3D stacked die package utilizes integrated side wall antennas to provide an ultra-high frequency antenna array configured to transmit and/or receive signals at sub-THz frequencies, such as 300 GHz and above. By utilizing a side wall of a 3D stacked die package (also referred to as a "3D cube" or "3D die stack"), radiation patterns lateral to the 3D die stack may be realized. Antenna arrays on the side walls of a 3D die stack may further exhibit improved decoupling relative to conventional arrangements. Moreover, a single 3D stacked die package with integrated side wall antennas may include multiple antenna arrays. In contrast, conventional wafer/die level antenna arrays being co-planar with a wafer/die are limited to a top surface of a die/3D die stack. To implement multiple antenna arrays in a conventional manner, typically multiple dies and/or 3D die stacks would be used.

In this way, improved antenna array performance may be realized through integrated side wall antennas, and die space used more efficiently.

FIG. 1 is a schematic diagram of a die layer 100 of a semiconductor package with integrated side wall antennas, in accordance with various embodiments. The die layer 100 includes a die 105, which further includes bulk silicon layer 110a and one or more back end of the line (BEOL) layers 110b. The die 105 further includes an IP core 115, interconnects 120, through-silicon vias (TSVs) 125. It should be noted that the various components of the die layer 100 are schematically illustrated in FIG. 1, and that modifications to the various components and other arrangements of die layer 100 may be possible and in accordance with the various embodiments.

In various embodiments, the die layer 100 is a layer of a 3D stacked die package (e.g., a 3D die stack). Thus, the die layer 100 may be one die of the stacked die package. A stacked die package itself may include two or more die layers, such as die layer 100, which have been stacked (e.g., in a vertical direction) and bonded together.

Each die 105 may be planar in shape, and further include six faces (e.g., exterior surfaces): a bottom surface 130, top surface 140, and four side walls 135a-135d. In other embodiments, the die 105 may have a different 3D shape (e.g., a polyhedral shape and corresponding number of faces, or an irregular shape). Thus, it is to be understood that the shape and configuration of individual dies, such as die 105, is not limited to any one particular arrangement, and that in other examples, die 105 may take the form of a different shape.

In various embodiments, die 105 may include an intellectual property (IP) core 115. As used here, an IP core 115 includes, without limitation, a discrete, reusable, unit of logic, or a circuit design that has a defined input/output interface and behavior. The IP core 115 may, thus, be discrete from other parts of the IC and/or semiconductor die, and reused on the same and/or different die layers (e.g., die layer 100) of a 3D die stack.

In some embodiments, the IP core 115 may be coupled to TSVs 125, arranged along an edge of the die 105, by interconnects 120. TSVs 125 are through-hole vias formed into a silicon die and/or wafer, which passes through the bulk-silicon layer 110a and/or the one or more BEOL layers 110b. For example, forming TSVs 125 may include, without limitation, drilling (e.g., laser drilling) and/or etching the through-hole vias into the silicon die and/or wafer. TSVs 125 may further include an internal conductive layer (e.g., a metallization layer), in which internal surfaces of the TSV 125 are plated in a metal layer (e.g., copper plating or other process by which conductive material on the internal surfaces of through-hole/TSV 125). Thus, in some examples, the internal metallization layer may include a copper plating and/or copper film deposited within the through-hole of a respective TSV 125.

In various examples, interconnects 120 include conductive traces (e.g., metal, copper (Cu), etc.), microstrip, and/or conductive pads (e.g., copper pads). Accordingly, interconnects 120 may include any structures connecting different circuit elements, in this case, elements of the IP core 115 (e.g., different parts of the I/O circuitry of the IP core 115) to the TSVs 125. The interconnects 120, in some further examples, are formed in a coplanar arrangement with the die 105. Although depicted as having two TSVs 125 coupled to IP core 115 by a respective interconnects 120 for purposes of explanation, it is to be understood that in other embodiments, a die layer 105 may include more than two TSVs 125, or alternatively, less than two TSVs 125 (e.g., one TSV or no TSVs).

In some embodiments, the interconnects 120 and TSVSs 125 may be formed and/or deposited on the one or more BEOL layers 110b during the BEOL manufacturing process. Thus, the one or more BEOL layers 110b refers to one or more layers and/or components formed during the BEOL of an IC manufacturing process. Accordingly, as known to those skilled in the art, the BEOL of a manufacturing process includes the process of forming the one or more BEOL layers 110b, and may refer to a stage in the fabrication process for ICs in which contacts, such as conduct pads, wires, vias, other interconnect structures, and dielectric structures may be formed. This is in contrast with the front end of the line (FEOL) process, in which active die (e.g., transistors), and/or passive elements may be formed in silicon and/or semiconductor material, such as IP core 115. For example, passive elements may include, for example, filters and other components (e.g., resistive, capacitive, and/or inductive elements).

In various examples, TSVs 125 may be arranged and formed at a desired spacing and location along a side wall 135a-135d, according to an antenna array design. For example, individual die layers (e.g., die layer 100) of a 3D stacked die package may be stacked with a desired spacing, orientation, and/or positioning to create an antenna array on a side wall of 3D stacked die package. Thus, TSVs 125 of an individual die, such as die 105, may be arranged according to its respective position and orientation within the 3D stacked die package. According to various embodiments, one or more side walls 135a-135d may be cut, diced, grinded, and/or polished to expose at least part of the internal metallization layer of the TSVs 125. For example, exposing the internal metallization of the TSVs 125 may include a combination of processes, including, without limitation, saw cuts, grinding, and/or chemical-mechanical polishing (CMP).

In some examples, the process of exposing the internal metallization layer of the TSVs 125 may be performed at the level of an individual die, such as die 105, or on an individual 3D stacked die package, in which a side wall of the 3D stacked die package (and in turn the respective side walls of each of the die layers including die layer 100) are cut, grinded, and/or polished. In further examples, grinding and/or CMP may be performed on multiple 3D die stack packages that are reconstituted as a wafer/panel, with the side wall of interest for all 3D die stack packages forming one process surface. In this way, the internal metallization layer of the TSVs 125 may be exposed at one or more side walls 135a-135d. Accordingly, exposing TSVs 125 at a side wall may include any process by which at least part of the internal metallization layer of TSVs 125 are physically exposed to an exterior environment, or otherwise made accessible physically and/or electrically from an exterior of the die 105 and/or 3D stacked die package, via a respective side wall 135a-135d.

Figure 2:
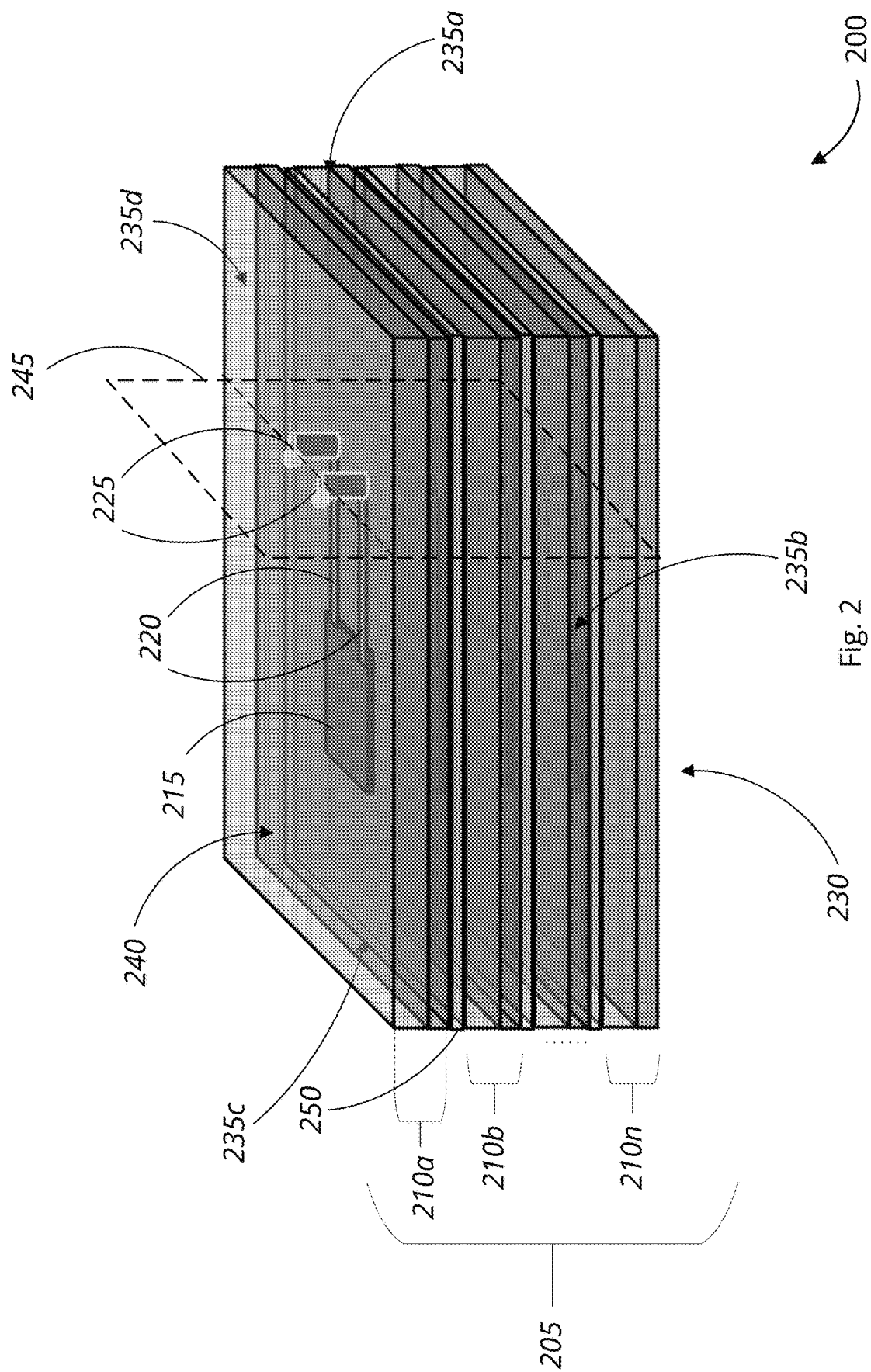
FIG. 2 is a schematic diagram of a semiconductor package before the exposing of integrated side wall antennas, in accordance with various embodiments.

FIG. 2 is a schematic diagram of a semiconductor package 200 before the integrated side wall antennas are exposed, in accordance with various embodiments. The semiconductor package 200 includes a 3D stacked die package 205 with two or more die layers 210, including a first die layer 210a, second die layer 210b, and so on through an n-th die layer 210n. Each die layer 210a-210n further includes a bulk silicon layer, one or more BEOL layers, and one or more adhesive layers 250 between each of the two or more die layers 210. Each die layer 210a-210n further includes a respective IP core 215, interconnects 220, and TSVs 225. It should be noted that the various components of semiconductor package 200 are schematically illustrated in FIG. 2, and that modifications to the various components and other arrangements of semiconductor package 200 may be possible and in accordance with the various embodiments.

In various embodiments, the semiconductor package 200 may include a 3D stacked die package 205. As depicted, the 3D stacked die package 205 may be formed in the shape of a cube or a cuboid. Thus, the 3D stacked die package 205 may include six faces (e.g., exterior surfaces): a bottom surface 230, top surface 240, and four side walls 235a-235d. In other examples, the 3D stacked die package 205 may have a different 3D shape (e.g., a polyhedral shape and corresponding number of faces, or an irregular shape). Thus, it is to be understood that in various embodiments, the shape and configuration of the 3D stacked die package 205 is not limited to any one particular arrangement, and that in other embodiments, the 3D stacked die package may have a different shape with a corresponding number of faces and side walls.

The 3D stacked die package 205 includes two or more die layers 210 that have been stacked in a vertical direction and bonded. In various examples, each die layer 2110a-210n may have a planar structure in which each individual die layer is bonded to at least one adjacent die layer. In some examples, the two or more die layers 210 may be bonded via one or more adhesive layers 250. The one or more adhesive layers 250 may include, without limitation, an epoxy or thermal interface material. In yet further examples, the two or more die layers 210 may be surface bonded, for example, via oxide-oxide bonding or hybrid bonding, Cu—Cu bonding, flip chip bonding, adhesive bonding, or other suitable bonding techniques.

In some embodiments, each individual die layer may respectively include an IP core 215. As previously described with respect to FIG. 1, an IP core 215 includes discrete, reusable units of logic or a circuit design that has a defined input/output interface and behavior. The IP core 215 may, thus, be discrete from other parts of the IC and/or semiconductor die, and reused on the same and/or different die layers of the 3D die stack package 205. Each IP core 215 may further be coupled to respective TSVs 225 arranged along an edge of the respective die layer 210a-210n (and in turn the edge of the 3D die stack 205) by respective interconnects 220. Interconnects 220 may include, for example, conductive traces (e.g., metal, copper (Cu), etc.), microstrips, and conductive pads (e.g., copper pads). Accordingly, interconnects 220 may include any structure connecting different circuit elements, in this case, elements of the IP core 215 (e.g., different parts of the I/O circuitry of the IP core 215) to the TSVs 225.

As previously described, in some examples, the 3D die stack package 205 may be cuboid in shape, and have a total of six rectangular (or square) faces. In the cuboid arrangement, the 3D die stack package 205 has four side walls, 235a-235d, a bottom surface 230, and a top surface 240. Stacking of the individual die layers 210a-210n may, in various examples, be performed at either the wafer-level (e.g., concurrent stacking of multiple die layers of multiple stacked 3D die packages or "cubes") and/or die level (e.g., stacking die layers of individual stacked 3D die packages).

In some examples, the TSVs 225 are formed through the respective individual die layers 210a-210n and internal metallization exposed during a grinding and/or cutting process. In other words, the TSVs 225 may be grinded along plane 245 to expose a cross-section of the TSVs 225 of each of the two or more die layers 210a-210n at the side wall (e.g., first side wall 235a), thus exposing the internal metallization layer of each of the TSVs 225. In some examples, the internal metallization layer may include a copper plating and/or copper film deposited within a through-hole (e.g., TSV 225).

In various examples, the TSVs 225 may be arranged and spaced at a desired pitch or positioning to create a desired arrangement of antenna array elements along the side wall, such as first side wall 235a. Accordingly, in various embodiments, the exposed, internal metallization layer may form respective antenna array elements of an antenna array. As used herein, an antenna array element may refer to individual antennas of an antenna array. In some examples, the TSVs 225 may further include all or part of transmission line (e.g., a feed line, etc.), coupling and/or feeding one or more antenna array elements. Accordingly, in various embodiments, individual layers may be stacked with a desired spacing, orientation, and/or positioning to create an antenna array of a given design, pattern, spacing, and/or orientation. The exposed internal metallization layers of respective TSVs 225 thus may form respective antenna array elements, and in some further examples, all or part of a transmission line of the antenna array. In some examples, the antenna array elements may include, without limitation, microstrip and/or patch antennas that are formed on a side wall, as opposed to being printed and/or deposited on a respective die (e.g., co-planar to the die layer 210a-210n). As known to those skilled in the art, a microstrip and/or patch antenna is typically a planar sheet (e.g., a "patch") of conductive material (e.g., metal such as copper) formed on a substrate. In various embodiments, the microstrip and/or patch antenna is formed on a side wall, the side wall serving as a "substrate" of the microstrip and/or patch antenna.

In various examples, an internal conductive layer (e.g., metallization layer) of the TSVs 225 may be exposed along the side wall (e.g., first side wall 235a). For example, the TSVs 225 may be exposed through a process of cutting, dicing, grinding, and/or polishing, as will be described in greater detail below with respect to FIG. 3.

Figure 3:
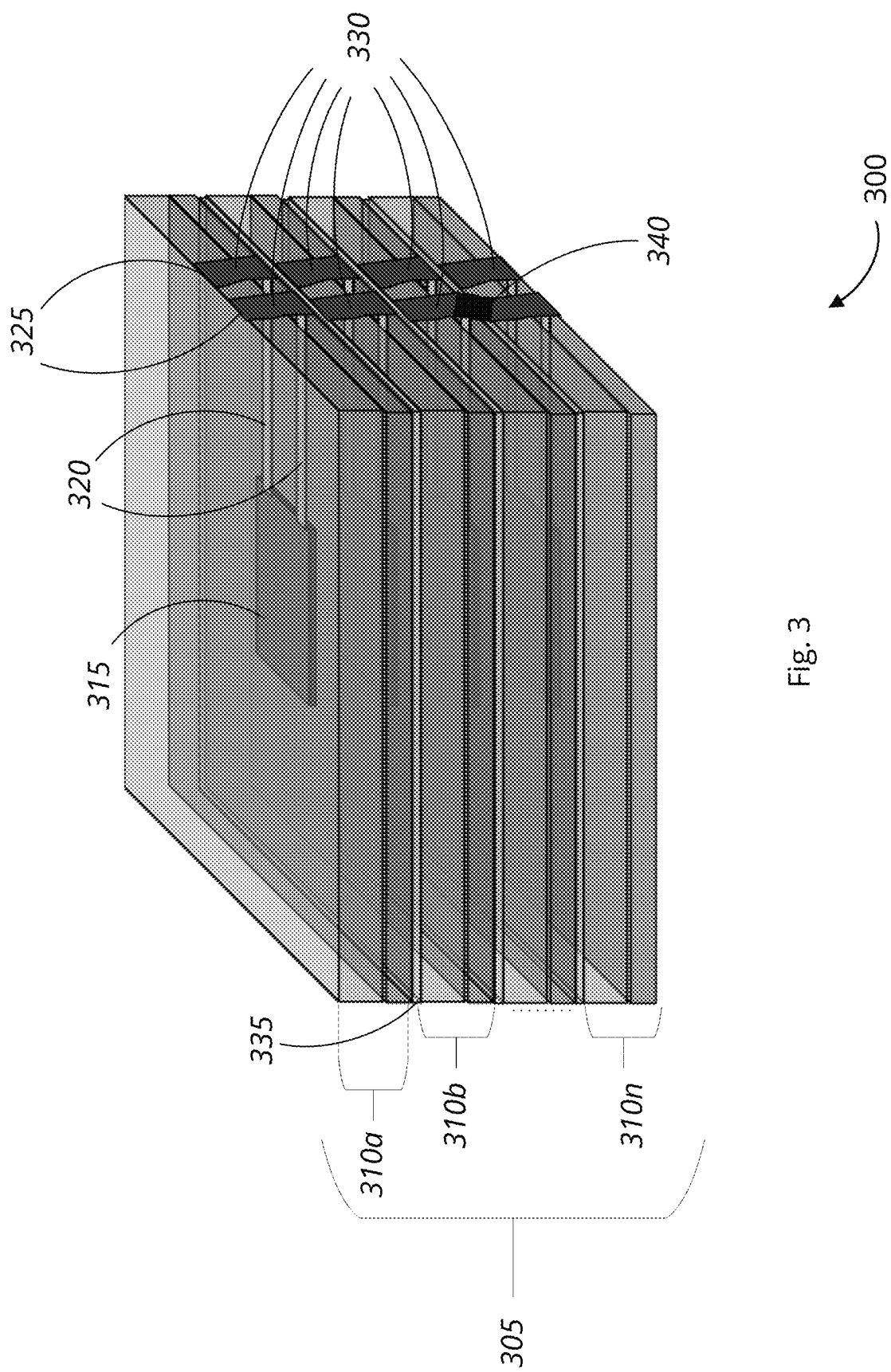
FIG. 3 is a schematic diagram of a semiconductor package with integrated side wall antennas, in accordance with various embodiments.

FIG. 3 is a schematic diagram of a semiconductor package 300 with integrated side wall antennas, in accordance with various embodiments. The semiconductor package 300 includes a 3D stacked die package 305 with two or more die layers 310a-310n. Each die layer 310a-310n further includes a bulk silicon layer, one or more BEOL layers, and one or more adhesive layers 335 between each of the two or more die layers 310a-310n. Each die layer 310a-310n further includes a respective IP core 315, interconnects 320, TSVs 325, and a plurality of antenna array elements 330. It should be noted that the various components of semiconductor package 300 are schematically illustrated in FIG. 3, and that modifications to the various components and other arrangements of semiconductor package 300 may be possible and in accordance with the various embodiments.

As previously described with respect to FIG. 2, FIG. 3 depicts the semiconductor package after an internal conductive layer of each of the respective TSVs 325 have been exposed, for example, by cutting, dicing, grinding and/or polishing along a plane dissecting each of the TSVs 325 of each of the two or more layers of the semiconductor package 300 (for example, plane 245 of FIG. 2). Accordingly, each of the antenna array elements 330 may form an antenna array along a side wall of the 3D stacked die package 305.

In various examples, once the interconnects 320 and TSVs 325 of the two or more die layers 310a-310n are formed, the side walls may be ground to expose TSVs 325, or in some examples, the interconnects 320. Specifically, interconnects 320 and TSVs 325 may be formed at the individual die layer extending towards an edge of the respective die layer, but not yet exposed. Thus, after stacking and bonding of the two or more die layers 310a-310n, a side wall may be cut, grinded, and/or polished. For example, exposing the interconnects 320 and/or TSVs 325 may include a combination of processes, including, without limitation, saw cuts, grinding, and/or CMP. In some examples, grinding and/or CMP may utilize multiple 3D die stack packages that are reconstituted as a wafer/panel, with the side wall of interest for all 3D die stack packages forming one process surface. Accordingly, exposing the interconnects 320 and/or TSVs 325 at a side may include any process physically exposing an internal conductive layer of the TSV 325 (or in some examples the interconnect 320) to an exterior environment, or otherwise made accessible physically and/or electrically from an exterior of the 3D stacked die package 305.

Although FIG. 3 depicts the antenna array elements 330 as being exposed along one side wall, it is to be understood that in other embodiments, the arrangement of the antenna array, and in turn antenna array elements, such as the plurality of antenna array elements 330 may be found on any subset of side walls or all side walls of the 3D die stack package 305. In further embodiments, antenna arrays may further be formed on side walls along with antenna arrays formed on a top surface of the 3D stacked die package 305.

Furthermore, in the embodiments depicted, each die layer of the two or more die layers 310a-310n includes two antenna array elements, respectively. In various examples, the plurality of antenna array elements 330 is arranged according to a design of an antenna array. Thus, in some examples, antenna array elements 330, and specifically respective TSVs 325, may be arranged to have a specific position within each layer, and with specific spacing so as to create an arrangement of antenna array elements according to the design of the antenna array.

Accordingly, in various embodiments, each of the plurality of antenna array elements 330 is an internal conductive layer (e.g., metallization layer) of a respective TSV 325. In various examples, the plurality antenna array elements 330 may include various types of individual antennas, such as, without limitation, microstrip antennas and/or patch antennas. In various examples, the plurality of antenna array elements 330 may, together, form at least part of an antenna array. In some examples, the internal metallization layer of two or more TSVs may be coupled so as to form, together, a respective antenna array element. For example, array element 340 includes two individual TSVs with respective internal metallization layers coupled together. In some examples, the internal metallization layers may be coupled, for example, via a copper plating process in which copper is deposited on the side wall, coupling the individual TSVs. In further examples, a conductive pad, wire, pillar, or other structure may be Cu—Cu bonded to the internal metallization layers of the respective individual TSVs, coupling the individual TSVs.

In various embodiments, the antenna array is formed on a side wall of the 3D stacked die package 305. In some examples, the antenna array may be configured to transmit and/or receive ultra-high, sub-THz frequency signals. For example, in some embodiments, the antenna array may be configured to transmit and/or receive radio frequency (RF) signals (e.g., wireless signals) that have frequencies of 300 GHz and above. In some examples, the antenna array may be configured to transmit and/or receive signals between 300 GHz and 1 THz, inclusive of 300 GHz and 1 THz, or a sub-band of frequencies in the 300 GHz to 1 THz range.

In further embodiments, the two or more die layers 310a-310n may include at least part of a wireless transceiver circuit. The wireless transceiver circuit may, in some examples, include all or part of a receive (Rx) and/or transmit (Tx) chain of a transceiver circuit. For example, the wireless transceiver circuit may include, without limitation, power amplifiers and/or low noise amplifiers coupled to the antenna array (e.g., plurality of antenna array elements 330), mixers, converters (e.g., digital-to-analog converters (DACs) and/or analog-to-digital converters (ADCs)), oscillators, or other components of RF circuitry. Accordingly, the transceiver circuit, or part of the transceiver circuit may be implemented as an RFIC. In some examples, an IP core 315 of a die layer 310a-310n may include all or part of an RFIC.

Figure 4:
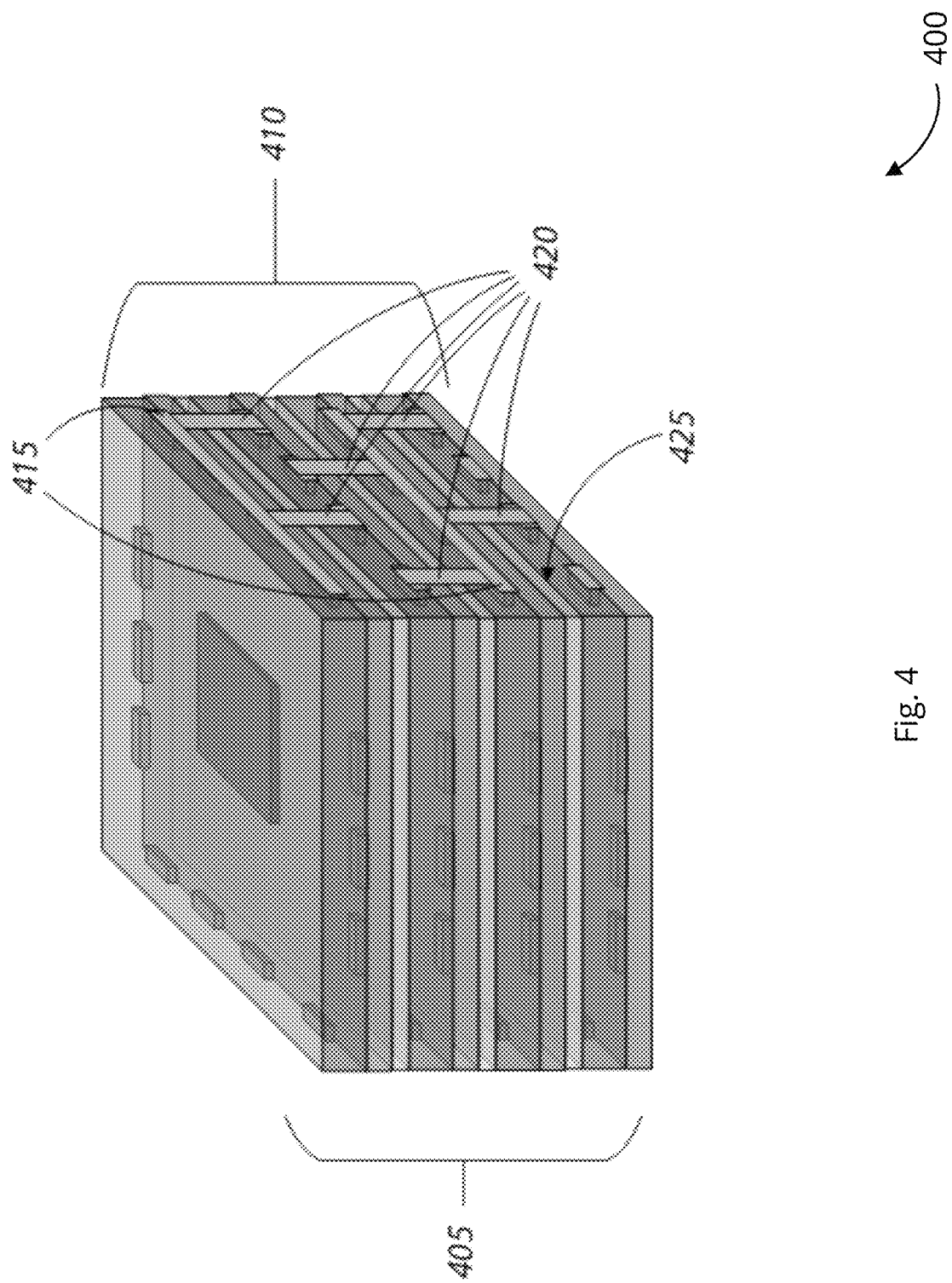
FIG. 4 is a schematic diagram of a semiconductor package with integrated side wall antennas in a redistribution layer, in accordance with various embodiments.

In the examples of FIGS. 1-3, the plurality of antenna array elements 330 are formed from an exposed internal conductive layer, such as an internal metallization layer, of respective TSVs 125, 225, 325. In other embodiments, an antenna array and/or antenna array elements may be formed by a redistribution layer (RDL), or more specifically, interconnects of a RDL, the RDL being formed on a side wall of a respective 3D stacked die package. FIG. 4 depicts one example of such an arrangement.

FIG. 4 is a schematic diagram of a semiconductor package 400 with integrated side wall antennas in a redistribution layer, in accordance with various embodiments. The semiconductor package 400 includes a 3D stacked die package 405, RDL 410, and one or more antenna array(s) 415 including a plurality of antenna array elements 420. It should be noted that the various components of semiconductor package 400 are schematically illustrated in FIG. 4, and that modifications to the various components and other arrangements of semiconductor package 400 may be possible and in accordance with the various embodiments.

In various examples, like the 3D stacked die package 305 of FIG. 3, the 3D stacked die package 405 may include two or more die layers that have been stacked. Each of the two or more die layers may include respective interconnects, such as copper pads, wiring, and/or traces extending towards an edge of the 3D stacked die package 405. In contrast with the stacked die package 305 of FIG. 3, the 3D stacked die package 405 may be diced, cut, grinded, and/or polished to expose the respective interconnects of the two or more die layers at a side wall 425 of the 3D stacked die package 405. The exposed interconnects at the side wall 425 may be coupled, and/or coupled via the RDL 410, to form a plurality of antenna array elements 420 of one or more antenna arrays 415, respectively.

A RDL, as used herein, refers to the metal (or other conductive material) interconnects that electrically and/or physically couple one part of a semiconductor package to another (e.g., interconnects between different components of a semiconductor package), and further provides conductive pads at other locations to allow I/O interfacing at other locations of the semiconductor package. Thus, RDLs may include copper pads, wiring, microstrips, and traces. RDLs may further include one or more layers through which interconnections may be present. In contrast with typical RDLs, which are coplanar with the die and/or substrate of the die, various embodiments of the 3D stacked die package 405 provide for one or more layers of RDL 410 that form (or are formed on) the side wall 425 of the 3D stacked die package 405.

In various examples, interconnects of the RDL 410 itself may form all or part of the one or more antenna arrays 415 on the side wall 425. Specifically, in some examples, copper pads, wiring, and/or traces of the RDL 410 may form the plurality of antenna array elements 420. In some examples, the interconnects of the RDL 410 may be coupled to one or more of the exposed interconnects of the two or more die layers. For example, the RDL 410 may include interconnects coupling an exposed interconnect of the two or more die layers to one or more other exposed interconnects of the two or more die layers. In some examples, the RDL may include interconnects (e.g., a pad, wiring, microstrip, or copper trace) coupled to a single exposed interconnect of the two or more die layers.

In some examples, the interconnects of the RDL 410 may be bonded to the exposed interconnects of the two or more die layers via a copper plating process. In other examples, a Cu—Cu bonding process, such as hybrid copper bonding (HCB) and/or direct copper bonding (DCB) may be used to bond the RDL 410 to interconnects of the two or more die layers. In yet further embodiments, the interconnects of the RDL may be bonded via solder bumps (e.g., microbumps (uBumps), Cu bumps, etc.) formed by the exposed interconnects of the two or more die layers, and/or through laser assisted bonding (LAB). As used herein, bumps and/or micro bumps may refer to solder micro bumps. Micro bumps, for example, may include copper pillars (CuP) having solder tips and/or solder caps. In some examples, exposed interconnects of the two or more die layers may form copper pillars on which solder tips may be formed.

In various examples, the RDL 410 may include one or more layers. Accordingly, in some embodiments, one or more interconnects of the one or more layers of RDL 410 are exposed at an exterior facing layer of the RDL 410 formed on the side wall 425. The exposed one or more interconnects of the one or more layers of RDL 410 exposed at the exterior facing layer of the RDL 410 may form respective antenna array elements of the plurality of antenna array elements 420. The one or more layers of RDL 410 may be formed, using traditional wafer level packaging processes. For example, in some embodiments, the one or more layers of RDL 410 may be formed from a plurality of dielectric layers, and from material such as, without limitation, polyimides (PI), polybenzoxazoles (PBO), and/or mold compounds (e.g., epoxy). Thus, using wafer level RDL-like processes, by reconstituting the 3D stacked die package 405 sideways, side wall RDLs may be realized on one or more side walls. In further embodiments, side wall RDLs may be formed, with or without RDLs on the top and bottom surfaces of the 3D stacked die package 405.

While FIG. 4 depicts RDL 410 as being formed on one side wall (e.g., side wall 425) of the 3D stacked die package 405, it is to be understood that in other embodiments, placement of the RDL is not limited to any particular side wall. Furthermore, in other examples, a RDL may be formed on a subset of side walls and/or all side walls of the 3D stacked die package 405.

Figure 5:
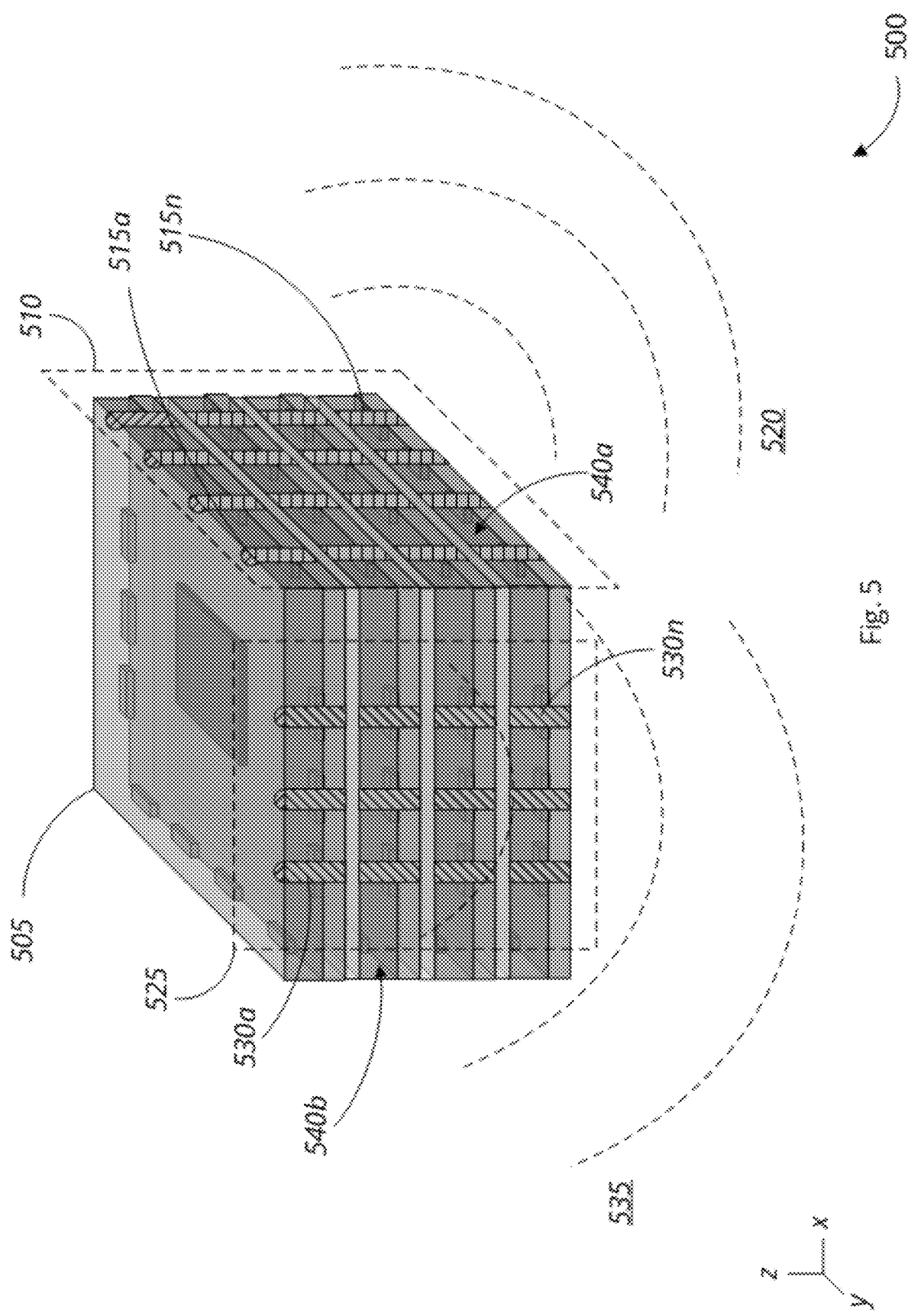
FIG. 5 is a schematic diagram of a semiconductor package with integrated side wall antennas on multiple side walls, in accordance with various embodiments.

FIG. 5 is a schematic diagram of a semiconductor package 500 with integrated side wall antennas on multiple side walls, in accordance with various embodiments. The semiconductor package 500 includes a 3D stacked die package 505 including a first antenna array 510 including a first plurality of antenna array elements 515a-515n, the first antenna array 510 formed on a first side wall 540a, and having a first radiation pattern 520. The 3D stacked die package 505 further includes second antenna array 525 including a second plurality of antenna array elements 530a-530n, the second antenna array 525 formed on a second side wall 540b, and having a second radiation pattern 535. It should be noted that the various components of semiconductor package 500 are schematically illustrated in FIG. 5, and that modifications to the various components and other arrangements of semiconductor package 500 may be possible and in accordance with the various embodiments.

In various embodiments, as previously described, either of the first antenna array 510 and/or second antenna array 525 may be formed from TSVs, in which the respective plurality of antenna array elements 515a-515n, 530a-530n are formed from an exposed internal conductive layer of respective TSVs. Similarly, in some examples, either of the first antenna array 510 and/or second antenna array 525 may be formed from respective RDLs formed on respective side walls of the 540a, 540b of the 3D stacked die package 505.

In yet further examples, antenna arrays may be found on additional side walls, a subset of side walls, or all side walls of the 3D stacked die package 505. In the example depicted, antenna arrays 510, 525 are formed on adjacent side walls 540a, 540b. In other examples, the antenna arrays may alternatively be formed on opposite side walls of the 3D stacked die package 505.

In some embodiments, the first antenna array 510 may have a first radiation pattern 520, and second antenna array 525 may have a second radiation pattern 535. In some examples, the antenna arrays 510, 525 may be the same design of antenna arrays, and include similar radiation patterns 520, 535. In other examples each of the first and second antenna arrays 510, 525 have different respective radiation patterns 520, 535. In some examples, the first antenna array being positioned on a first side wall 540a may have a radiation pattern 520 that emits a wireless signal in a first direction that is lateral to the 3D die stack (e.g., 3D stacked die package 505). In other words, the 3D die stack may be stacked in a vertical direction (e.g., along a z-axis). The first antenna array 520 may thus be configured to emit a wireless signal having the first radiation pattern 520 in a first direction (e.g., in a direction along an x-axis). Similarly, the second antenna array 525 may be configured to emit a wireless signal having a second radiation pattern 535 along a second direction (e.g., in a direction along ay-axis).

In the example depicted, for purposes of explanation, the first and second antenna arrays 510, 525 are depicted as being an array of patch antennas and/or microstrip antennas. It is to be understood, however, that in other embodiments, other antenna array designs may be utilized and that antenna array designs are not limited to any single design.

Figure 6:
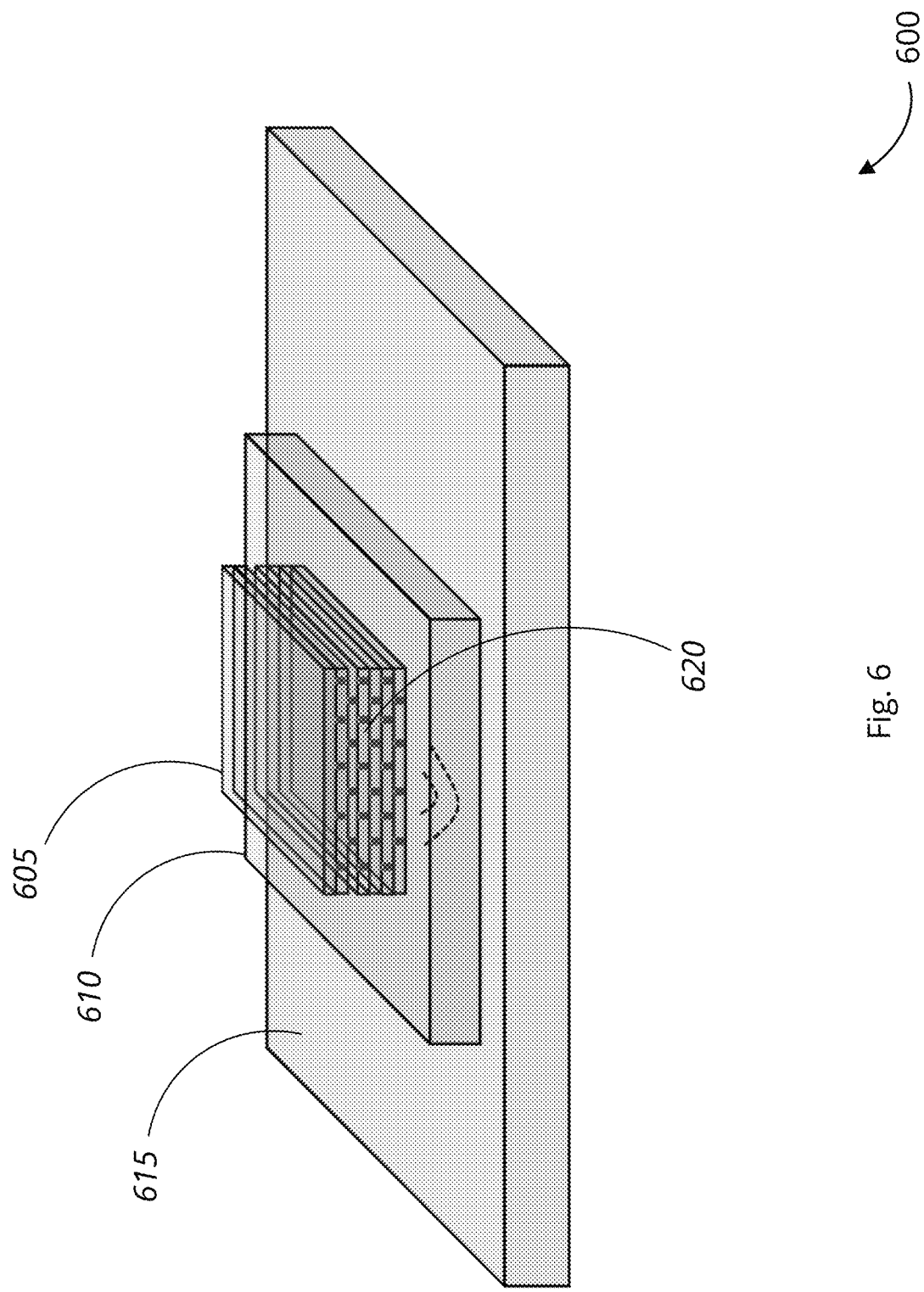
FIG. 6 is a schematic diagram of a semiconductor device including a 3D stacked die package with integrated side wall antennas, in accordance with various embodiments.

FIG. 6 is a schematic diagram of a semiconductor device 600 including a 3D stacked die package with integrated side wall antennas bonded to additional dies, in accordance with various embodiments. The semiconductor device 600 includes a 3D stacked die package 605 including antenna array 620, a bottom die 610, and substrate 615. It should be noted that the various components of semiconductor device 600 are schematically illustrated in FIG. 6, and that modifications to the various components and other arrangements of semiconductor device 600 may be possible and in accordance with the various embodiments.

In various embodiments, the 3D stacked die package 605 may include an antenna array 620 formed on a side wall of the 3D stacked die package 605, as previously described with respect to FIGS. 1-5. The 3D stacked die package 605 may, in some examples, be coupled to a bottom die 610, via Cu—Cu bonding (e.g., HCB and/or DCB). The bottom die 610 may include an active die to which the 3D stacked die package 605 may be coupled.

In some examples, the bottom die 610 may include all or part of a wireless transceiver circuit, as previously described. Similarly, in some examples, the 3D stacked die package 605 may itself include at least part of a wireless transceiver circuit. The wireless transceiver circuit may, in some examples, include all or part of a receive (Rx) and/or transmit (Tx) chain of a transceiver circuit. For example, the wireless transceiver circuit may include, without limitation, power amplifiers and/or low noise amplifiers coupled to the antenna array 620, mixers, converters (e.g., digital-to-analog converters (DACs) and/or analog-to-digital converters (ADCs)), oscillators, or other components of RF circuitry. Accordingly, the transceiver circuit, or part of the transceiver circuit may be implemented as an RFIC. In some examples, the bottom die 610 is an RFIC configured to provide a signal for transmission to the antenna array 620 and/or receive a signal from the antenna array 620.

In further examples, the bottom die 610 may be coupled to a substrate 615. The substrate 615 may be configured to provide a surface for die placement. In some examples, the substrate 615 may include a chip carrier die, printed circuit board (PCB), or other suitable substrate. In some examples, the substrate 615 may itself include two or more internal layers (e.g., routing layers), through which component interconnects may be present. In some examples, the bottom die 610 may be coupled to the substrate 615 via a flip-chip bonding process (e.g., solder micro bumps with underfill material), and/or Cu—Cu bonding process (e.g., HCB/DCB). As the 3D stacked die package 605 is bonded to the top of the bottom die 610, the function of the antenna array 620 may be isolated, or otherwise remain unaffected by the connections between the bottom die 610 and substrate 615.

Figure 7:
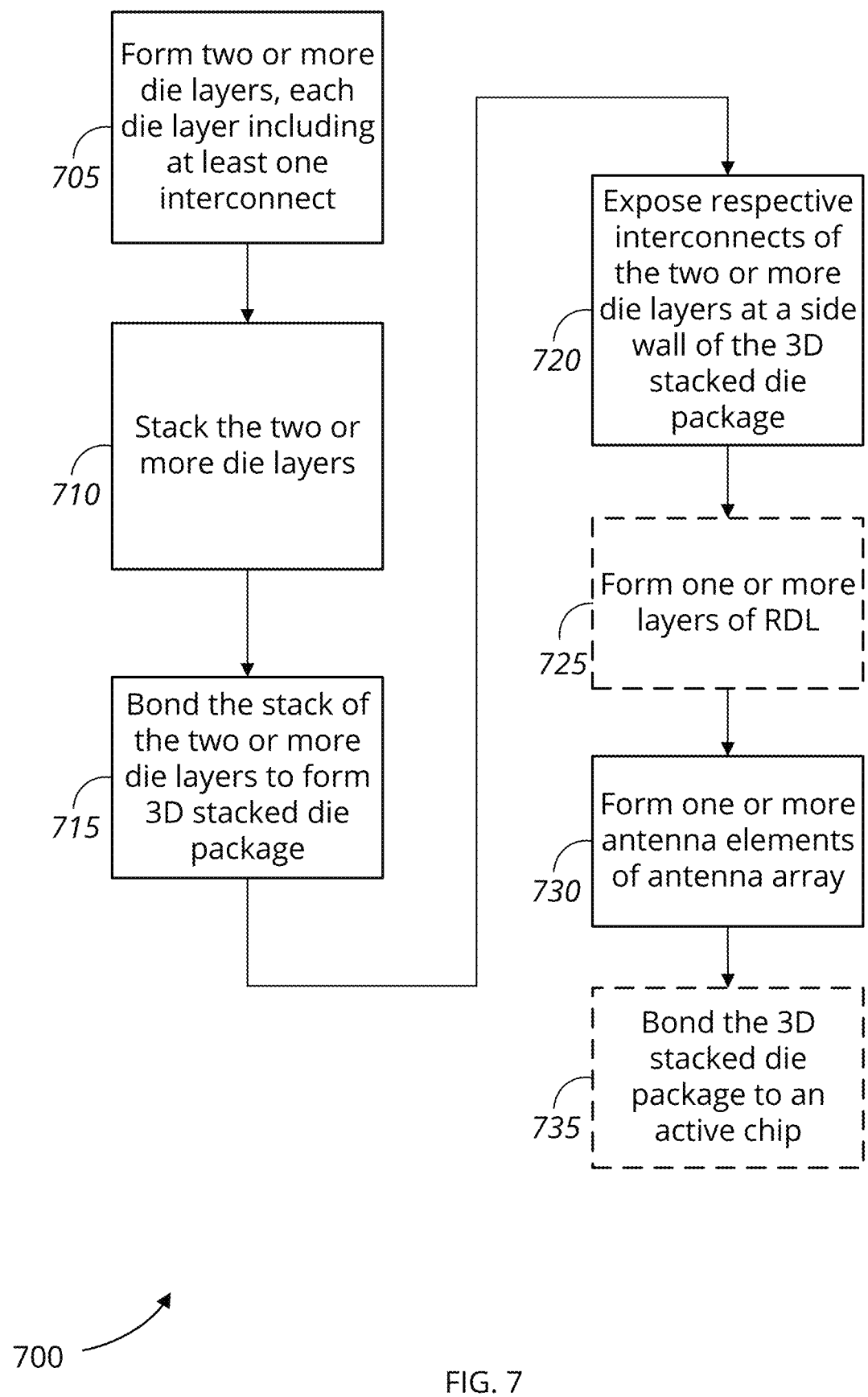
FIG. 7 is a flow diagram of a method of manufacturing a 3D chip stack with integrated side wall antennas, in accordance with various embodiments.

FIG. 7 is a flow diagram of a method 700 of manufacturing a 3D chip stack with integrated side wall antennas. The method 700 includes, at block 705, forming two or more die layers, each die layer including at least one interconnect. As previously described, each die layer may include respective IP cores, and at least one interconnect extending outwards towards the edge of a die (e.g., die layer). The interconnects may include conductive wires, traces, pads, and TSVs formed during a BEOL process. The interconnects may be deposited or otherwise formed as part of the die or on a die substrate. In some examples, TSVs may be formed towards an edge of the two or more die layers. TSVs may be formed, for example, by forming a through-hole via in the respective die layers, and plating the interior of the through-hole via with an internal conductive layer (e.g., a metallization layer, such as copper).

The method 700 continues, at block 710, by stacking the two or more die layers. As previously described, the two or more die layers may be stacked in a vertical direction. In some examples, the two or more die layers may be arranged with a spacing, orientation, and/or in a sequence (e.g., a sequence of two or more die layer designs) so as to produce an arrangement of antenna array elements. For example, the two or more die layers may be stacked to create an antenna array of a specific design, having a specific positioning, spacing, and orientation of antenna array elements. Stacking of the two or more die layers may, in various examples, be performed at either the wafer-level (e.g., concurrent stacking of multiple die layers of multiple stacked 3D die packages or "cubes") and/or die level (e.g., stacking die layers of individual stacked 3D die packages).

The method 700 continues, at block 715, by bonding the stack of two or more die layers to form a 3D stacked die package. Suitable bonding techniques may include surface bonding (e.g., oxide-oxide bonding, hybrid bonding), Cu—Cu bonding, flip chip bonding, adhesive bonding, or other suitable bonding techniques.

The method 700 may further include, at block 720, exposing respective interconnects of the two or more die layers at a side wall of the 3D stacked die package. As previously described, in some examples, TSVs of the two or more die layers may be exposed through a process of cutting, grinding, and/or polishing to expose the internal conductive layer of the TSVs. In some embodiments, the TSVs may be exposed at a side wall through a combination of processes, including, without limitation, saw cuts, grinding, and/or CMP. In some examples, grinding and/or CHIP may be performed on the wafer level, with the side wall of interest for all 3D die stack packages forming one process surface of the reconstituted wafer/panel. In yet further embodiments, interconnects such as wires, traces, or copper pads may be exposed through a similar process. Exposing of interconnects thus includes a process by which the interconnects are physically exposed to an exterior environment, or otherwise made accessible physically and/or electrically from an exterior of the 3D stacked die package.

In some examples, the method 700 continues, at block 725, forming one or more layers of RDL at the side wall. As previously described, a RDL may be formed at the side wall, coupling two or more layers of the 3D stacked die package. In some examples, the RDL may include one or more layers formed at the side wall. The RDL may be formed using traditional wafer level packaging processes. For example, in some embodiments, the one or more layers of RDL may be formed from a plurality of dielectric layers, and from material such as, without limitation, PI, PBO, and/or mold compounds. Thus, by reconstituting the 3D stacked die package sideways (e.g., laterally), side wall RDLs may be realized on all side walls. In further embodiments, side wall RDLs may be formed, with or without RDLs on the top and bottom surfaces of the 3D stacked die package. In some examples, the interconnects (e.g., pads, wiring, traces, etc.) of the side wall RDL may further be coupled to the interconnects of the two or more die layers. In some examples, the interconnects of the RDL may be coupled to the interconnects of the two or more die layers via solder bonding/micro bumps (e.g., solder micro bumps, copper post with solder tip, etc.), Cu—Cu bonding (including HCB and/or DCB), and/or a Cu plating process.

At block 730, the method 700 continues by forming one or more antenna array elements at the side wall. As previously described, in some examples, the one or more antenna array elements may be formed by the internal conductive layer (e.g., internal metallization layer) of respective TSVs that have been exposed at a die wall. In further embodiments, the one or more antenna array elements may be formed via the interconnects of the RDL. In some examples, one or more antenna array elements may together form an antenna array may be configured to transmit and/or receive radio frequency (RF) signals (e.g., wireless signals) that have frequencies of 300 GHz and above. In some examples, the antenna array may be configured to transmit and/or receive signals between 300 GHz and 1 THz, inclusive of 300 GHz and 1 THz, or a sub-band of frequencies in the 300 GHz to 1 THz range. Antenna array elements may include, without limitation, microstrip and/or patch antennas that are formed on the side wall of the 3D stacked die package.

At block 740, the method 700 includes bonding the 3D stacked die package to an active chip. As previously described, the 3D stacked die package may be coupled to an active chip (e.g., active die). Bonding the 3D stacked die package to the active die ma include through a Cu—Cu bonding process (e.g., HCB and/or DCB). As previously described, in some examples, active die may include all or part of a wireless transceiver circuit, as previously described. For example, the wireless transceiver circuit may include, without limitation, power amplifiers and/or low noise amplifiers coupled to the antenna array, mixers, converters (e.g., digital-to-analog converters (DACs) and/or analog-to-digital converters (ADCs)), oscillators, or other components of RF circuitry. In some further examples, the active chip may include an RFIC.

The techniques and processes described above with respect to various embodiments may be used to manufacture semiconductor packages 200, 300, 400, 500, semiconductor device 600, and/or components thereof, as described herein.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An apparatus comprising:
   two or more die layers that are bonded together, each of the two or more die layers comprising a top surface, bottom surface, and one or more side walls,
   wherein a first side wall of the one or more side walls includes a first antenna array, the first antenna array comprising a first plurality of antenna array elements formed in at least one of the two or more die layers, wherein the first plurality of antenna array elements is at least partially exposed at the first side wall, the first plurality of antenna array elements comprising internal metallization layers of through-silicon vias (TSVs), two or more of the internal metallization layers being coupled at the first side wall.

2. The apparatus of claim 1, wherein at least a second side wall of the one or more side walls comprises a second antenna array, the second antenna array comprising a second plurality of antenna array elements formed in at least one of the two or more die layers, wherein the second plurality of antenna array elements is at least partially exposed at the second side wall.

3. The apparatus of claim 1, wherein the at least one of the two or more die layers includes a plurality of through-silicon vias (TSVs) that form the first plurality of antenna array elements, wherein an internal metallization layer of each respective TSV of the plurality of TSVs is at least partially exposed at the first side wall.

4. The apparatus of claim 3, wherein each TSV of the plurality of TSVs forms a respective antenna array element of the first plurality of antenna array elements.

5. The apparatus of claim 1, wherein the first plurality of antenna array elements includes one or more patch antennas.

6. The apparatus of claim 1, wherein the first antenna array is configured to transmit a wireless signal with a frequency of 300 gigahertz or higher.

7. The apparatus of claim 1, further comprising a redistribution layer (RDL) formed on the first side wall, the RDL comprising a plurality of interconnects that form the first plurality of antenna array elements, wherein the plurality of interconnects includes one or more of a conductive wire, trace, or pad.

8. The apparatus of claim 1, wherein at least one die layer of the two or more die layers includes at least part of a wireless transceiver circuit, wherein the wireless transceiver circuit includes an amplifier coupled to the first antenna array.

\* \* \* \* \*